United States Patent
Huang et al.

(10) Patent No.: US 9,806,392 B2
(45) Date of Patent: Oct. 31, 2017

(54) CROSSTALK, POWER SUPPLY NOISE AND/OR EMI REDUCTION METHODS AND APPARATUSES

(71) Applicant: Intel Corporation, Santa Clara, CA (US)

(72) Inventors: Shaowu Huang, Steilacoom, WA (US); Hanqiao Zhang, DuPont, WA (US); Kai Xiao, University Place, WA (US); Beom-Taek Lee, Mountain View, CA (US); John J. Abbott, Dupont, WA (US); Gary Charles, Austin, TX (US)

(73) Assignee: Intel Corporation, Santa Clara, CA (US)

( * ) Notice: Subject to any disclaimer, the term of this patent is extended or adjusted under 35 U.S.C. 154(b) by 138 days.

(21) Appl. No.: 14/716,101

(22) Filed: May 19, 2015

(65) Prior Publication Data

US 2016/0344085 A1 Nov. 24, 2016

(51) Int. Cl.
*H01P 3/08* (2006.01)
*H04B 3/32* (2006.01)
*H05K 1/02* (2006.01)
*H05K 9/00* (2006.01)

(52) U.S. Cl.
CPC ............ *H01P 3/081* (2013.01); *H04B 3/32* (2013.01); *H05K 1/02* (2013.01); *H05K 9/0022* (2013.01)

(58) Field of Classification Search
CPC .......... H01P 3/081; H01P 11/003; H04B 3/32; H05K 9/0022; H05K 1/02
USPC ............ 333/1, 104, 161, 204, 211, 238, 246
See application file for complete search history.

(56) References Cited

U.S. PATENT DOCUMENTS

2015/0327357 A1* 11/2015 Khan ...................... H01P 3/084
333/1

* cited by examiner

*Primary Examiner* — Benny Lee
*Assistant Examiner* — Hafizur Rahman
(74) *Attorney, Agent, or Firm* — Schwabe, Williamson & Wyatt, P.C.

(57) ABSTRACT

Apparatuses and methods associated with shield lines, and/or complementary decoupling capacitors and/or electromagnetic absorbing materials are disclosed herein. In embodiments, an apparatus may include a substrate having a ground plane; and a first and a second transmission line disposed on the substrate. Further, the apparatus may include a shield line constituted with electromagnetic absorbing material disposed between the first and second transmission lines and not coupled with the ground plane. In embodiments, the substrate may further include a power plane having a plurality of edges and a plurality of spacing; a plurality of decoupling capacitors disposed on the power or ground plane; and electromagnetic absorbing materials adhered to the plurality of edges and disposed in the plurality of spacing. Other embodiments may be described and/or claimed.

16 Claims, 16 Drawing Sheets

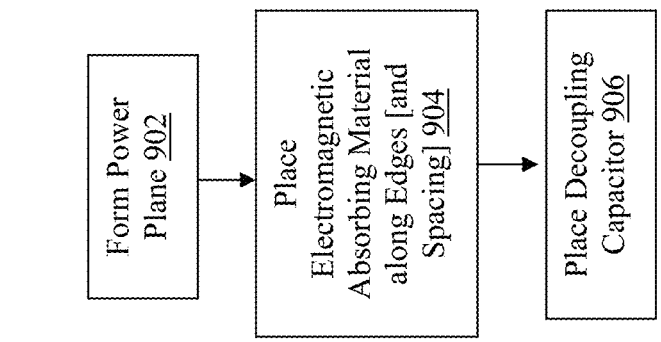
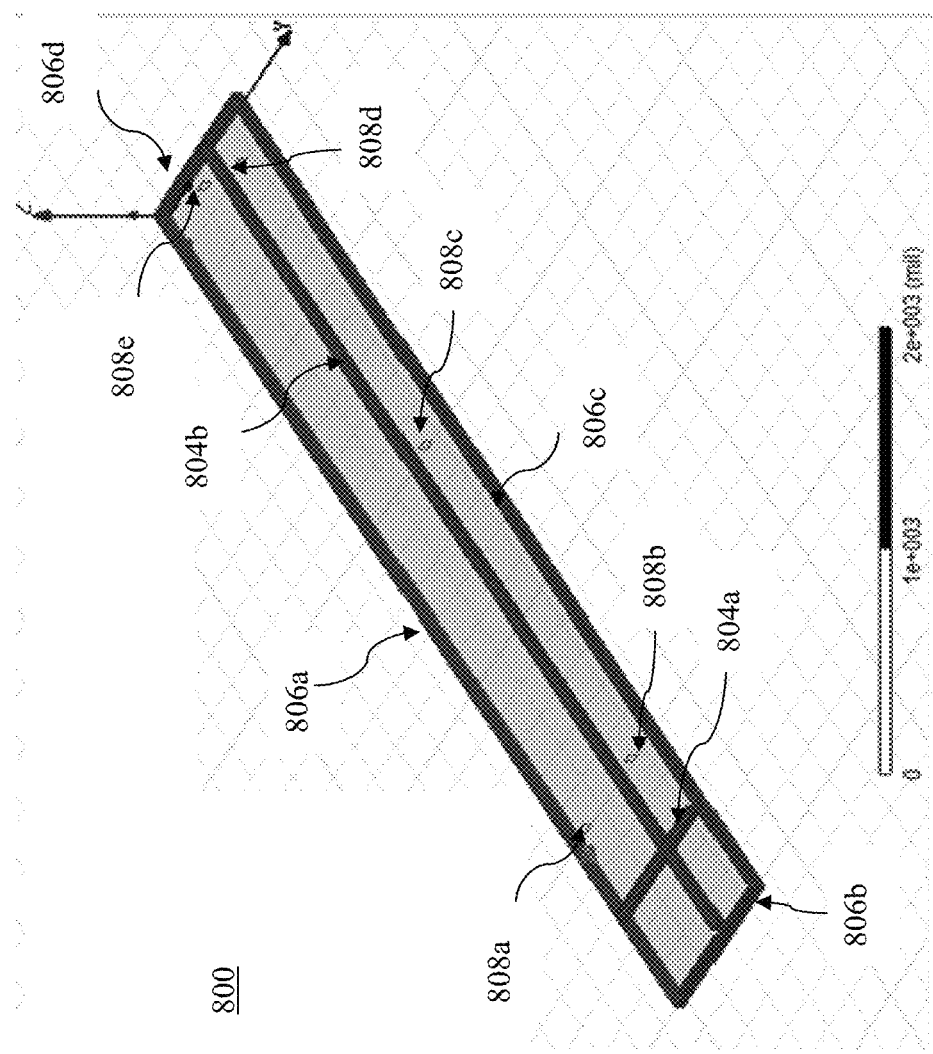
Figure 9
Figure 8

CROSSTALK, POWER SUPPLY NOISE AND/OR EMI REDUCTION METHODS AND APPARATUSES

TECHNICAL FIELD

The present disclosure relates to the field of electronics. More particularly, the present disclosure relates to apparatus and method for reducing crosstalk, power supply noises, and electromagnetic interference (EMI) in printed circuit boards (PCB), and/or semiconductor package substrates.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

Increasingly many electronic systems, such as server platforms, require ever-growing data transfer rate. Resultantly, longer and lossier customized channel and higher routing density in printed circuit boards (PCBs) and/or semiconductor package substrates are often needed. All these factors aggravate the crosstalk interference among adjacent transmission lines in PCB and/or semiconductor package substrates, such as microstrips.

Present solutions typically include: (1) increase the spacing between two routings, which however is not attractive due to the increase in PCB and/or package substrate area and cost; (2) mitigate far end crosstalk (FEXT) by replacing microstrips with striplines, but this is not doable in many practical designs or adds cost; or (3) add a conductor guard trace between two microstrips, but it requires shorting with at least two ground vias at the end points of the microstrips, which can cause some issues in practical design. With respect to conductor guard trace, grounding may lead to a number of problems. First, the impedance discontinuity caused by ground vias can severely degrade the signaling performance. Because the lowest resonant frequency is determined by the maximum spacing of any two adjacent ground vias, it often requires the maximum spacing to be as small as possible. Second, if there is no ground via placed at the end of routing, the open stub of guard line can also degrade the signaling performance. For example, in package design, grounded shield line can lead to "open-stub line". Third, the ground vias may also make negative impact on the internal layer signal routings.

Also, many electronic systems have to suppress power supply noises and/or alleviate EMI and electromagnetic compatibility (EMC) issues. Typically, decoupling capacitors are employed to suppress power supply noises. To alleviate EMI/EMC, typically, stitching via on PCB, ferrite bead on cables and/or metallic gasket or enclosure at chassis is employed. Both power supply noises and EMI issues are aggravated by the Cavity Resonant Edge Effects (CREE) in PCBs and packages. Further, if a large number of decoupling capacitors are employed to address the power supply noises, the bill of materials would increase, and the useable surface area of a PCB would decrease, resulting in an increase in cost.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIG. 8 illustrates an example power plane of the PCB incorporated with the hybrid decoupling capacitor and electromagnetic absorbing material technique of the present disclosure to reduce power supply noises and/or EMI, according to various embodiments.

FIG. 9 illustrates an example process for making the PCB with a power plane having complementary decoupling capacitors and electromagnetic absorbing material, according to various embodiments.

DETAILED DESCRIPTION

Figure 1:
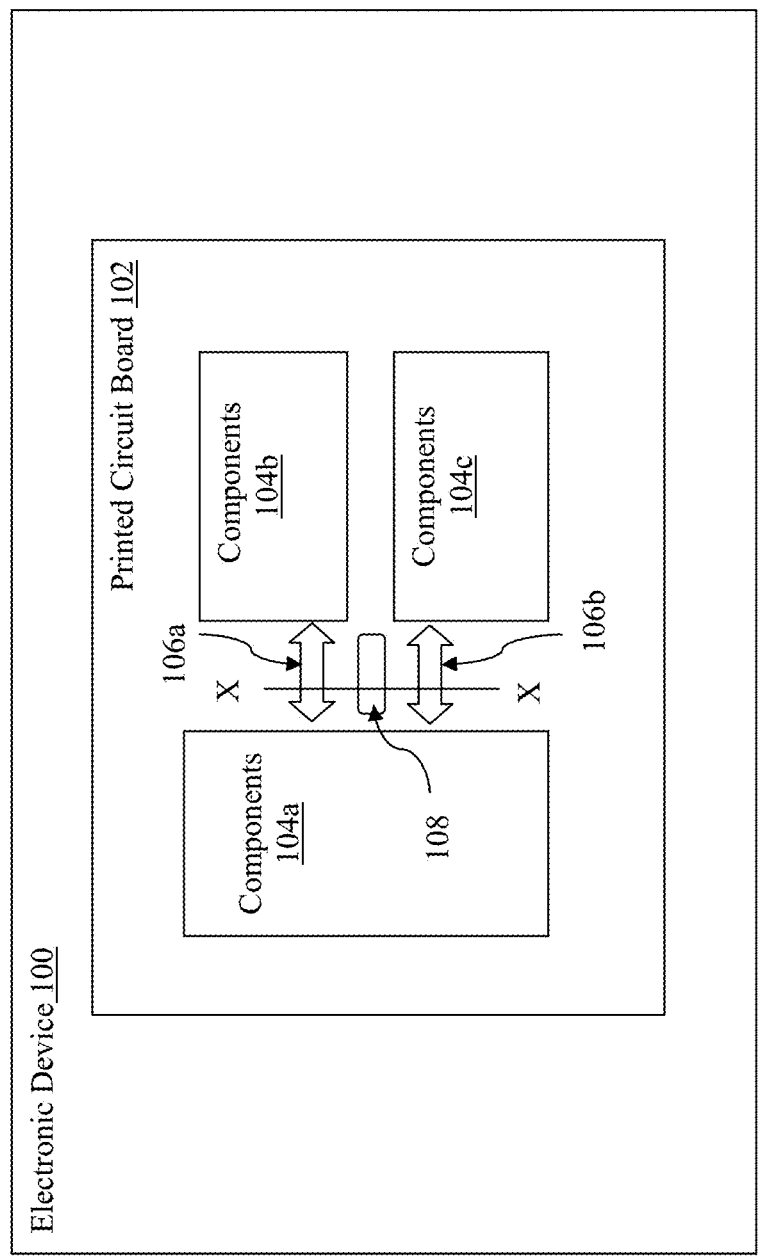
FIG. 1 illustrates an apparatus having a substrate (e.g., a PCB) incorporated with the shield line technology of the present disclosure to reduce crosstalk, according to various embodiments.

Apparatuses and methods associated with shield lines and/or complementary decoupling capacitors and electromagnetic absorbing materials are disclosed herein. In embodiments, an apparatus may include a substrate having a ground plane; a first and a second transmission line disposed on the substrate. Further, the apparatus may include a shield line constituted with electromagnetic absorbing material disposed between the first and second transmission lines and not coupled with the ground plane. The shield line may reduce the first and second transmission lines' crosstalk interference with each other, without the disadvantages of the prior art solutions. In embodiments, the first and second transmission lines may be microstrips or striplines.

In embodiments, the substrate may further include a power plane, having a plurality of edges and a plurality of spacing; a plurality of decoupling capacitors disposed on the power or ground plane; and electromagnetic absorbing materials adhered to the plurality of edges and disposed in the plurality of spacing. The electromagnetic absorbing materials may be provided to complement the decoupling capacitors to suppress power supply noises and/or reduce EMI.

In embodiments, the apparatus may be a semiconductor package or a PCB having the substrate, the first and second transmission lines and the shield lines, or a computing device having such a semiconductor package or PCB.

In the following detailed description, reference is made to the accompanying drawings which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Aspects of the disclosure are disclosed in the accompanying description. Alternate embodiments of the present disclosure and their equivalents may be devised without parting from the spirit or scope of the present disclosure. It should be noted that like elements disclosed below are indicated by like reference numbers in the drawings.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "module" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

Referring now to FIG. 1, wherein a block diagram illustrating an apparatus having a substrate (e.g., a PCB) incorporated with the shield line technology of the present disclosure to reduce crosstalk, according to various embodiments, is shown. As illustrated, in embodiments, apparatus 100 may include substrate 102. In some embodiments, apparatus 100 may be a semiconductor package. In other embodiments, apparatus 100 may be an electronic device, and substrate 102 may be a PCB. For ease of understanding, the remaining description will be presented primarily through the embodiments of an electronic device 100 having a PCB 102 incorporated with the shield line technology of the present disclosure to reduce crosstalk. However, it should be understood that the description applies equally to embodiments of semiconductor packages.

As illustrated, PCB 102 may include a number of electronic components 104a-104c coupled with each other, e.g., via first and second transmission lines 106a-106b. Further, PCB 102 may be provided with shield line 108 having electromagnetic absorbing material disposed between the first and second transmission lines 106a-106b. Examples of electromagnetic absorbing material may include, but are not limited to, SB1001, SB1004, WX-A Series materials, available from Arc Technologies, Inc of Amesbury, Mass. In embodiments, shield line 108 may not be grounded, avoiding some of the major limitations of prior art solutions. Further, experience has shown that the electromagnetic absorbing material has negligible impact on the return loss (impedance) in the main signal line. Accordingly, shield line 108 may reduce the first and second transmission lines' crosstalk interference with each other without the disadvantages of the prior art solutions, enabling transmission lines 106a-106b to be disposed closer with each other to provide higher transmission rates, and resulting in denser high speed transmission lines for PCB 102.

In embodiments, transmission lines 106a-106b may be single ended microstrips or differential microstrip pairs. In alternate embodiments, transmission lines 106a-106b may be single ended striplines or differential stripline pairs. Components 104a-104c may be any number of electronic components known in the art, including, but art not limited to, single or multi-core general purpose processors, graphics co-processors, mathematics co-processors, digital signal processors, persistent storage, encryption/decryption engines, security engines, network interface cards and so forth. Except for the shield line technology of the present disclosure, electronic device 100 and PCB 102, may be any number of electronic devices/PCB known in the art. For example, electronic device 100 may be a computing device, such as a blade server, and PCB 102 may be a motherboard.

Before further describing the shield line technology of the present disclosure, it should be noted that while for ease of understanding, only one PCB 102, 3 components 104a-104c and two transmission lines 106a-106b are shown in FIG. 1, the present disclosure is not so limited. Electronic device 100 may have any number of PCB 102, and each PCB 102 may have any number of transmission line pairs 106a-106b shielded from each other by additional corresponding shield lines 108, subject only to space availability.

Figure 2:
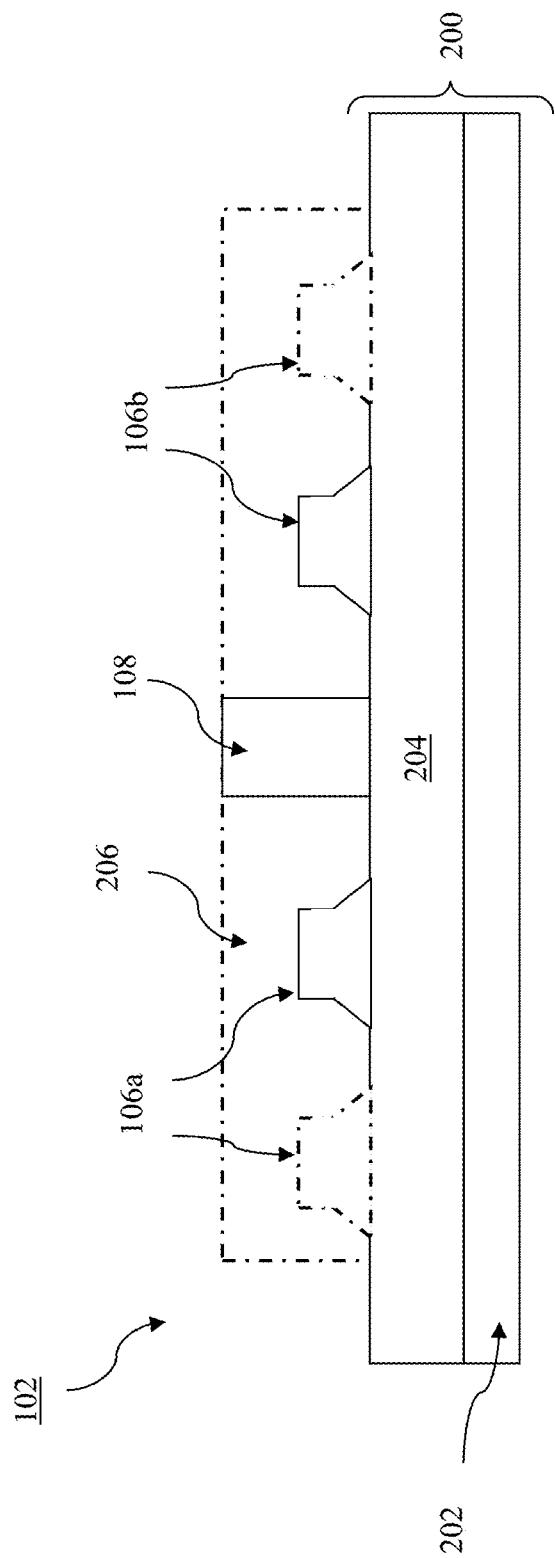
FIG. 2 illustrates a cross section view of the PCB showing a pair of microstrips with a shield line disposed in between, according to various embodiments.

Referring now to FIG. 2, wherein a cross section view of the PCB (along the X-X axis of FIG. 1) illustrating a pair of microstrips with a shield line disposed in between, according to various embodiments, is shown. As illustrated, PCB 102 may include substrate 200 having ground plane 202, and dielectric layer 204 disposed on top of ground plane 202. Further, microstrips 106a and 106b may be disposed on top of dielectric layer 204. As shown, microstrips 106a and 106b may be single ended or differential pairs (as depicted by the additional dotted companion lines). Disposed in between microstrips 106a-106b is shield line 108 having electromagnetic absorbing materials 108 to reduce crosstalk interferences of microstrips 106a-106b with each other. Further, in embodiments, soldermask 206 may be provided to cover both microstrips 106a-106b and shield line 108.

In embodiments, each of the microstrip lines 106a-106b may have a width of about 4.6 mils and a height of about 2.7 mils, and spaced about 13.5 mils from each other. Shield line 108, in embodiments, may be constituted with electromagnetic absorbing material that attenuates electromagnetic noises from 5 MHz to 40 GHz or higher. Shield line 108 may have a width of about 5 mils and a height of about 8 mils. In embodiments, the layer of soldermask 206 may have the same height as shield line 108 as depicted in FIG. 2. In other embodiments, the layer of soldermask 206 may have a height that is higher than the height of shield line 108, such as 20-30 mils. Experience has shown that shield line 108 with electromagnetic absorbing material allows larger manufacturing tolerance than grounded shield lines.

Figure 3:
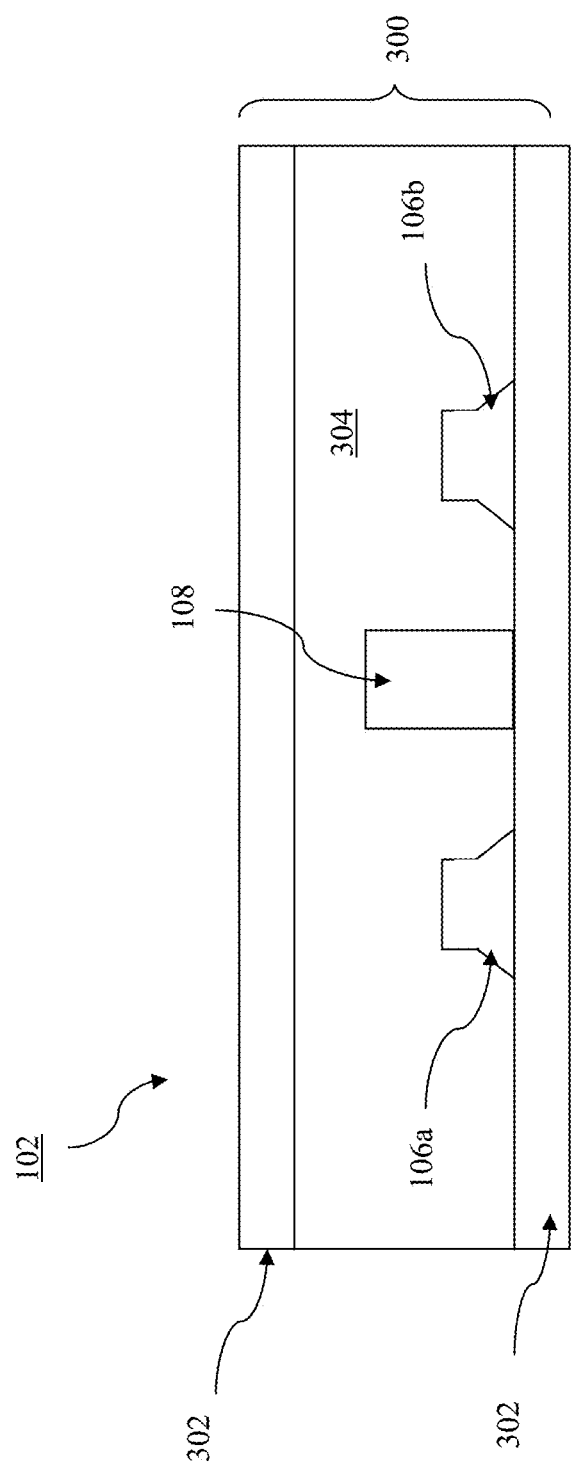
FIG. 3 illustrates a cross section view of the PCB showing a pair of striplines with a shield line disposed in between, according to various embodiments.

Referring now to FIG. 3, wherein a cross section view of the PCB (along X-X axis of FIG. 1) illustrating a pair of striplines with a shield line disposed in between, according to various embodiments, is shown. As illustrated, PCB 102 may include substrate 300 having two ground planes 302, and dielectric layer 304 disposed in between ground planes 302. Further, striplines 106a and 106b may be integrated in dielectric layer 304. As shown, striplines 106a and 106b may be single ended (although, in alternate embodiments, it may be differential pairs). Disposed in between striplines 106a-106b is shield line 108 having electromagnetic absorbing materials 108 to reduce crosstalk interferences of striplines 106a-106b with each other. Shield line 108 is also integrated as part of dielectric layer 304. The dimensions and/or attributes of striplines 106a-106b and shield line 108 may be similar to the microstrip embodiments earlier described with references to FIG. 2.

Figure 4:
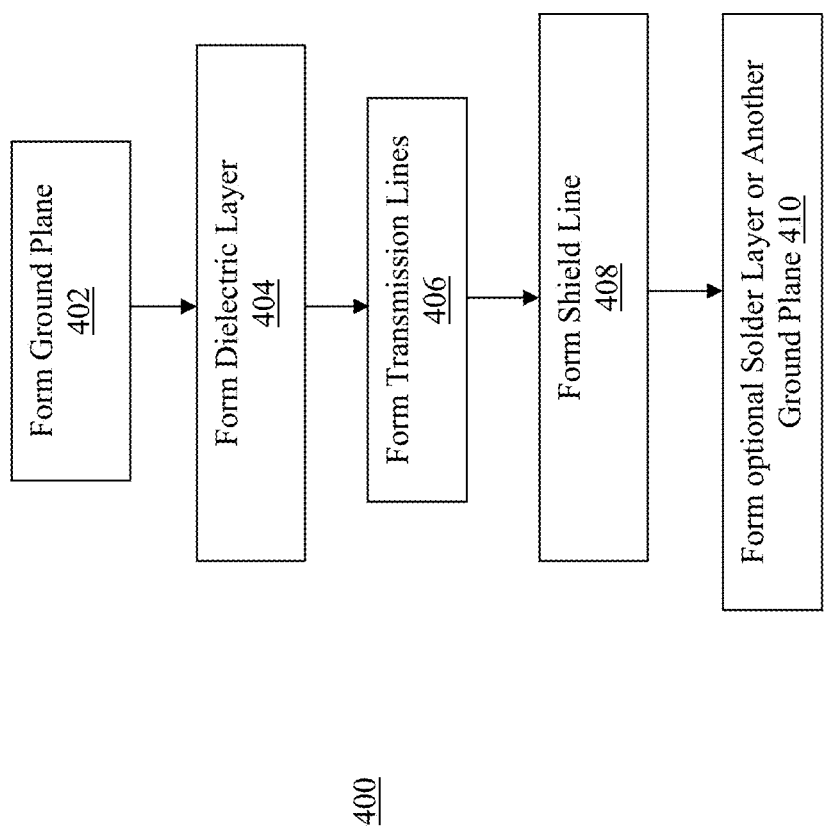
FIG. 4 illustrates an example process for making a PCB with transmission and shield lines, according to various embodiments.

Referring now to FIG. 4, wherein a flow diagram illustrating an example process for making a PCB with transmission and shield lines, according to various embodiments, is shown. As illustrated, in embodiments, process 400 for making a PCB with transmission and shield lines may include operations performed at blocks 402-410. In alternate embodiments, process 400 may be performed with more or less operations, or in different order.

Process 400 may start at block 402. At block 402, a ground plane may be formed. Next at block 404, a dielectric layer may be formed. At block 406, the transmission lines may be formed. For microstrips, the transmission lines may be formed on top of the dielectric layer. For striplines, the transmission lines may be integrated with the dielectric layer. At block 408, the shield line may be formed in between the transmission lines. For microstrips, the shield line may be formed on top of the dielectric layer. For striplines, the shield line may be integrated with the dielectric layer. In alternate embodiments, the shield line may be formed with the transmission lines at the same time, or its formation interleaved with the formation of the transmission lines, e.g. a transmission line, the shield line, then the other transmission line. At block 410, an optional solder layer may be formed for microstrips or another ground plane may be formed for striplines.

Figure 5:
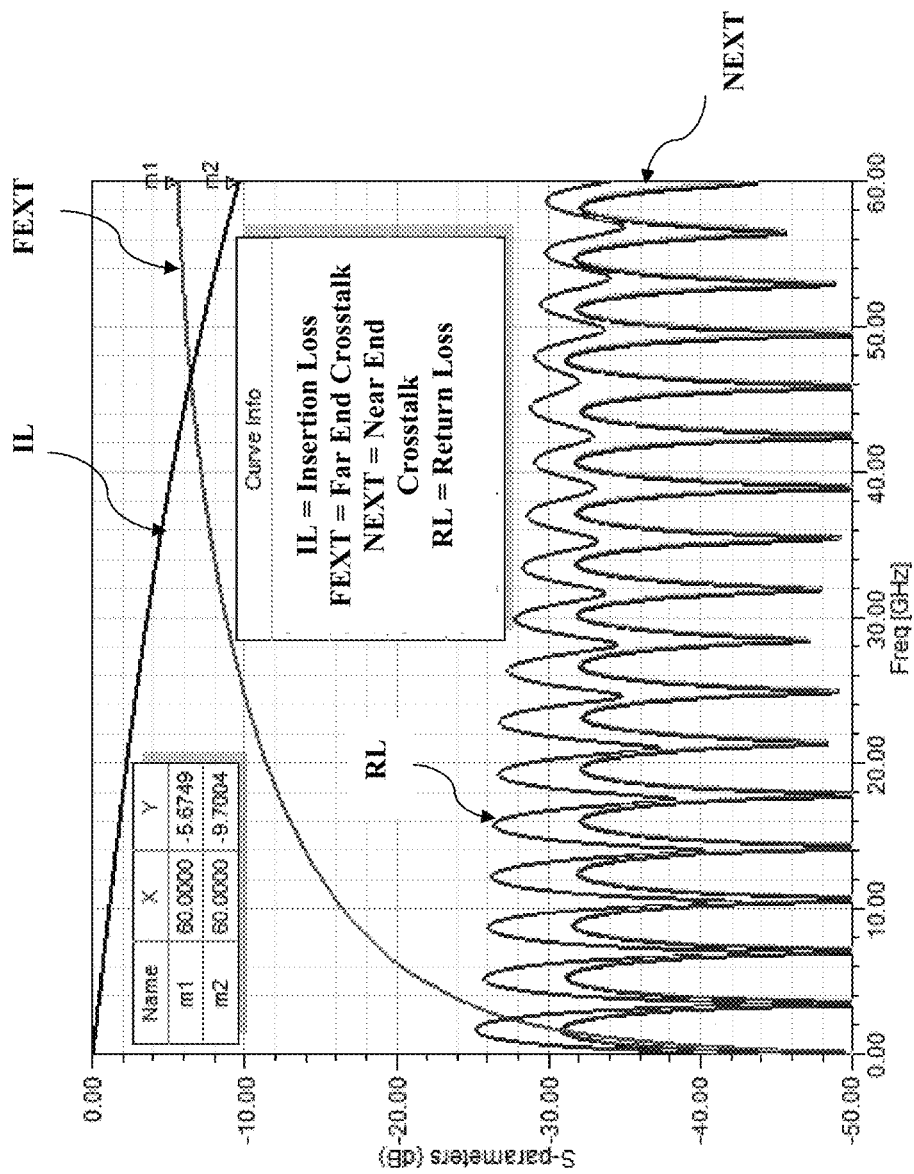
FIGS. 5-7 illustrate representative performance simulation results of the PCB having the shield line technology of the present disclosure, according to various embodiments.
Figure 6:
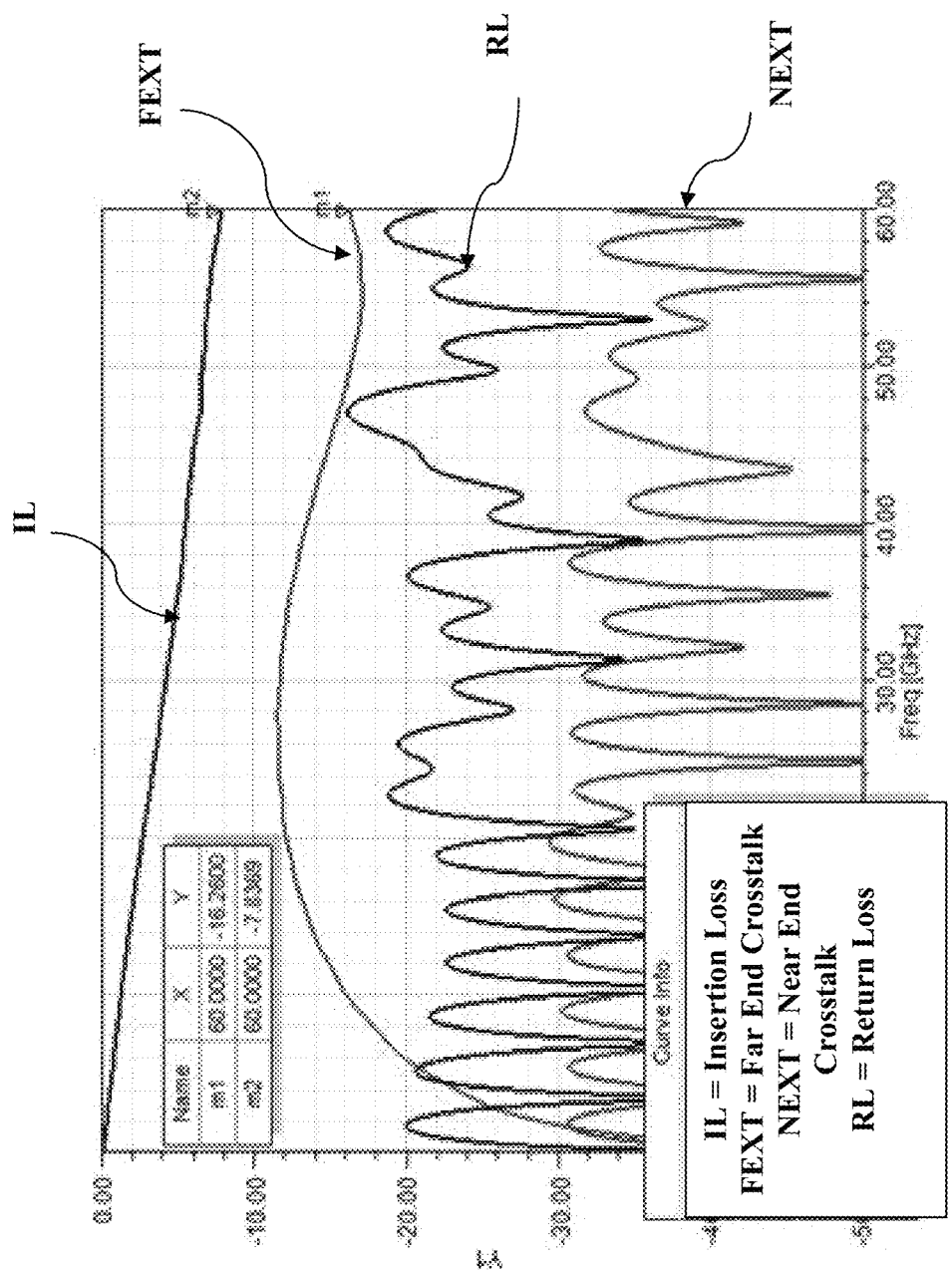
Figure 7:
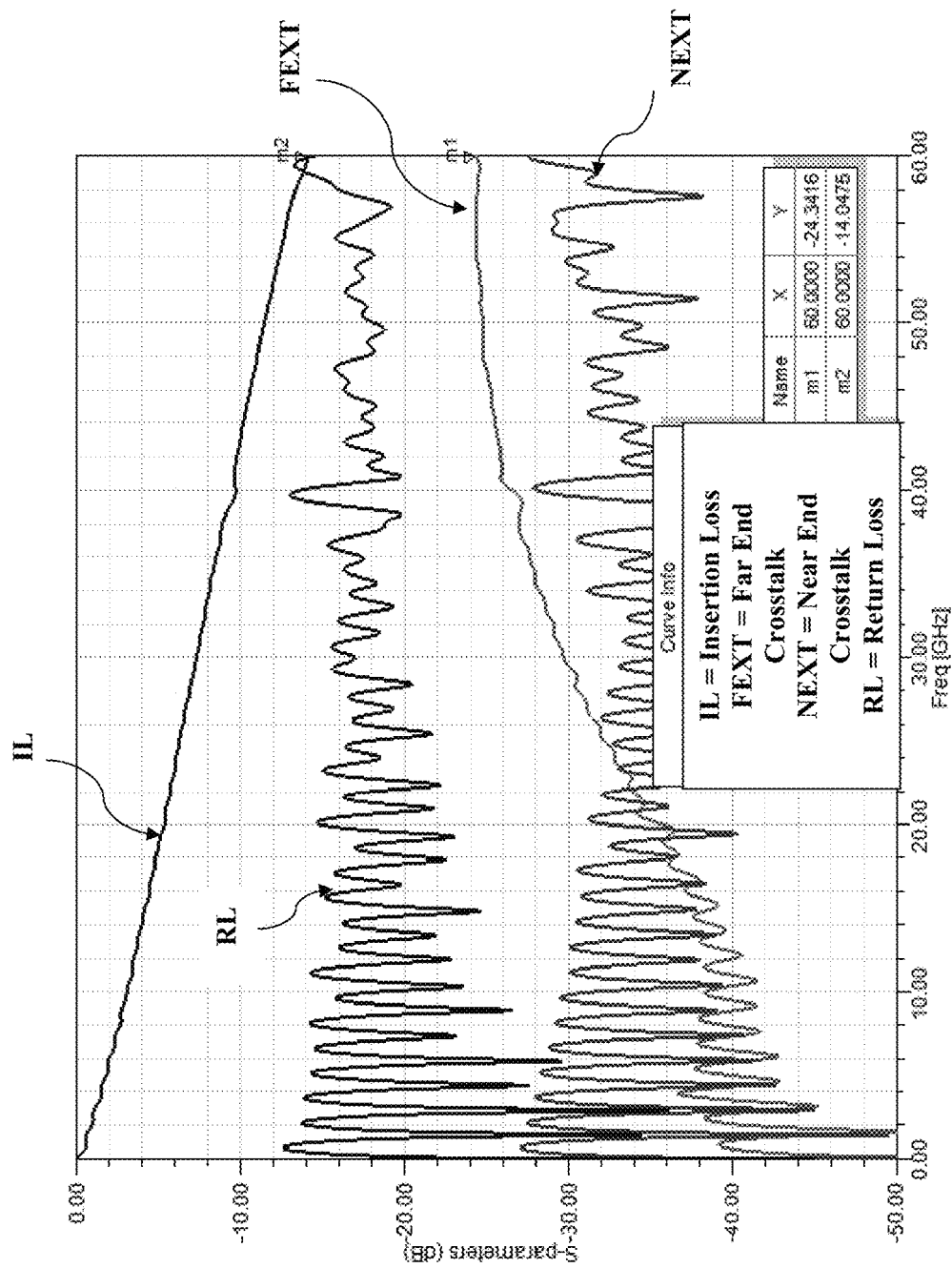
Figure 10:
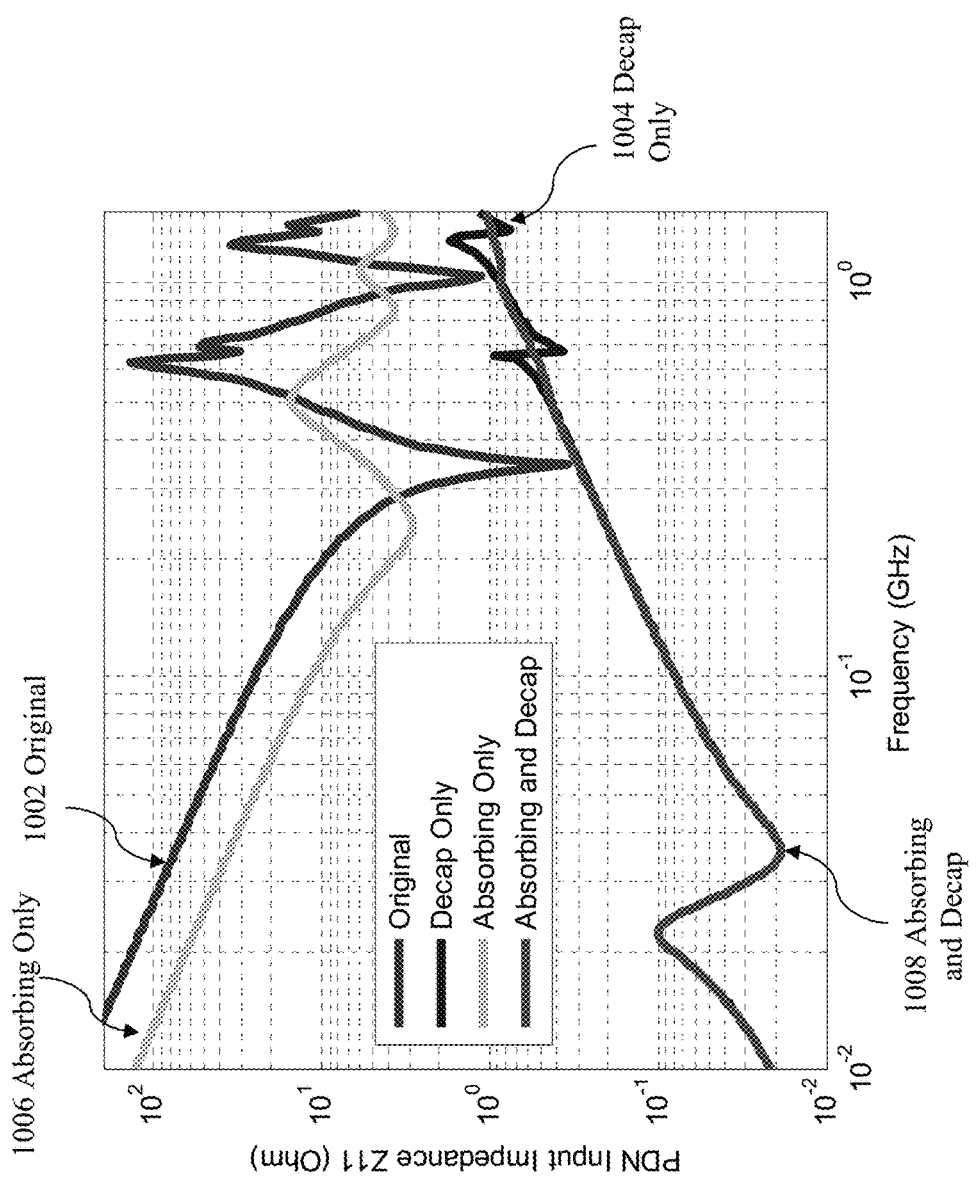
FIGS. 10-15 illustrate representative performance simulation results of the PCB having the hybrid decoupling capacitor and electromagnetic absorbing material technique of the present disclosure, according to various embodiments.

Referring now to FIGS. 5-7, wherein representative performance simulation results of the PCB of the present disclosure, according to various embodiments, are illustrated. More specifically, FIG. 5 illustrates the insertion loss (IL), far end cross talk (FEXT), near end cross talk (NEXT) and return loss (RL), for an example pair of microstrips proximately disposed, without the benefit of a shield line. As depicted, FEXT increases exponentially with frequency to about −5.6 dB. At above 30 GHz, the signal transmission degrades significantly to a level close to or lower than the FEXT. Thus, it is evident that for longer and lossier traces, it is critical to design transmission lines with FEXT crosstalk suppression capability, or increase spacing would be required to suppress the FEXT. However, that would increase the board area and cost.

FIG. 6, similarly, illustrates the insertion loss (IL), far end cross talk (FEXT), near end cross talk (NEXT) and return loss (RL), for an example pair of microstrips proximately disposed, however with the benefit of a shield line (but without employment of a soldermask), as earlier described. It can be seen that the crosstalk can be significantly suppressed by the shield line having electromagnetic absorbing material. For example, crosstalk can be suppressed by −11 dB at 60 GHz. It is observed that the wider the shield line width, the lower crosstalk on a wider frequency bandwidth.

Further, RL and NEXT dependency on shield line width can be neglected. As a result, better crosstalk reduction can be achieved by using wider shield line in between the microstrip pair. The simulation results also indicate that there can be good manufacturing tolerance for the filling widthness of the shield line.

FIG. 7, also similarly, illustrates the insertion loss (IL), far end cross talk (FEXT), near end cross talk (NEXT) and return loss (RL), for an example pair of microstrips proximately disposed, however with the benefit of a shield line and employment of a soldermask, as earlier described. As can be seen, the results demonstrate the crosstalk can be significantly improved by the employment of the shield line together with soldermask, however IL and RL may be degraded due to the change of effective dielectric constant and characteristic impedance of the microstrip pair, thus its employment may be application dependent.

Referring now briefly back to FIG. 1, in embodiments, PCB 102 may include a power plane. FIG. 8 illustrates an example power plane of PCB 102 incorporated with the hybrid decoupling capacitor and absorbing material technique of the present disclosure to reduce power supply noises and EMI, according to various embodiments. As illustrated, power plane 800 may have a number of decoupling capacitors 808a-808e disposed thereon to supply power supply noises. Further, power plane 800 may have a number of edges 806a-806d with electromagnetic absorbing material adhered thereto, and a number of spacing 804a-804b with electromagnetic absorbing material disposed therein. Examples of electromagnetic absorbing material may include, but are not limited to, the earlier described SB1001, SB1004, WX-A Series materials, available from Arc Technologies, Inc. of Amesbury, Mass. While decoupling capacitor is more effective for relatively low frequency noise, and electromagnetic absorbing material is effective for broadband noise suppression at high frequency resonances, through their novel combination, decoupling capacitors 808a-808e and electromagnetic absorbing material adhered to edges 806a-806d and disposed in spacing 804a-804b may improve PDN impedance performance and reduce EMI more effectively and less expensive at the same time.

In embodiments, decoupling capacitors 808a-808e may be, but are not limited to, Monolithic Ceramic Capacitors (MLCC). The capacitance values may be between 0.1 uF and 22 uF. The equivalence series resistance (ESR) and equivalence series inductance (ESL) of the 0.1 uF may be 20 mOhm and 238 pH respectively. For the 22 uF, ESR and ESL may be 2 mOhm and 368 pH. Electromagnetic absorbing materials may any one of a number of commercially available electromagnetic absorbing materials, such as, but are not limited to, MT-30 available from Cuming Corporation of Avon, Mass., U.S.A. The electromagnetic absorbing materials may be pasted, glued, taped, or painted on the edges. The thickness of the electromagnetic absorbing materials may vary from application to application. For many applications, a thickness of 10 mils may provide sufficient suppression. The small gaps between the edges and the electromagnetic absorbing materials, e.g., due to the adhesive (which is typically several mils in thickness), do not appear to be a significant performance consideration. In embodiments, the size of spacing 806a-806b may be about 10 mils.

More specifically, the electromagnetic energy associated with the cavity resonance may be absorbed by the electromagnetic absorbing material adhered to edges 806a-806d and disposed in spacing 804a-804b, and the power distribution network (PDN) impedance noise for a band of frequencies may be dampened. Decoupling capacitors 808a-808e may be populated on the power plane, where the resonance characteristics are modulated with the electromagnetic absorbing material. In other words, the decoupling capacitors may be placed along the edges to effectively target CREE and PDN noise. Through increase in the capacitance at the resonant frequencies, PDN cavity resonant impedance may be reduced. Because the PDN of power plane cavity is a passive linear time invariant (LTI) system, the benefits of employing electromagnetic absorbing material and decoupling capacitors will be added up. As the amplitude of the magnetic current at the resonant frequency is reduced and the power plane PDN impedance is lowered, CREE is effectively mitigated. Resultantly, decoupling capacitors 808a-808e, complemented with the electromagnetic absorbing material, may be more effective in controlling the resonance of PDN.

FIG. 9 illustrates an example process for making a PCB with a power plane having complementary decoupling capacitors and electromagnetic absorbing material, according to various embodiments. As shown, process 900 may include the operations at block 902-906. At block 902, a power plane may be formed. The power plan may be formed in accordance with any one of a number of techniques known in the art. Next at block 904, the electromagnetic absorbing material may be adhered to the edges of the power plane. Further, if there are spacing, the electromagnetic absorbing material may also be placed in the spacing. Then at block 906, the decoupling capacitors may be placed. As described earlier, the decoupling capacitors may be populated on the power plane, where the resonance characteristics are modulated with the electromagnetic absorbing material.

FIGS. 10-15 illustrate representative performance simulation results of the PCB having a power plane with the hybrid decoupling capacitor and electromagnetic absorbing material technique of the present disclosure, according to various embodiments. The results were obtained through simulation performed on a high frequency structural simulator (HFSS). More specifically, FIGS. 10-11 respectively show several self-impedance (Z11) and transfer impedance (Z21) plots. Each figure contains 4 curves. Curve 1002 shows the impedance characteristic of the PCB without usage of decoupling capacitors nor electromagnetic absorbing materials. Curve 1004 shows the impedance characteristics of the PCB having only the decoupling capacitors (Decap). Curve 1006 shows the impedance characteristics of the PCB using electromagnetic absorbing materials only. Curve 1008 shows the impedance characteristics of the PCB with the power plane having both decoupling capacitors and electromagnetic absorbing materials arranged as described.

Figure 11:
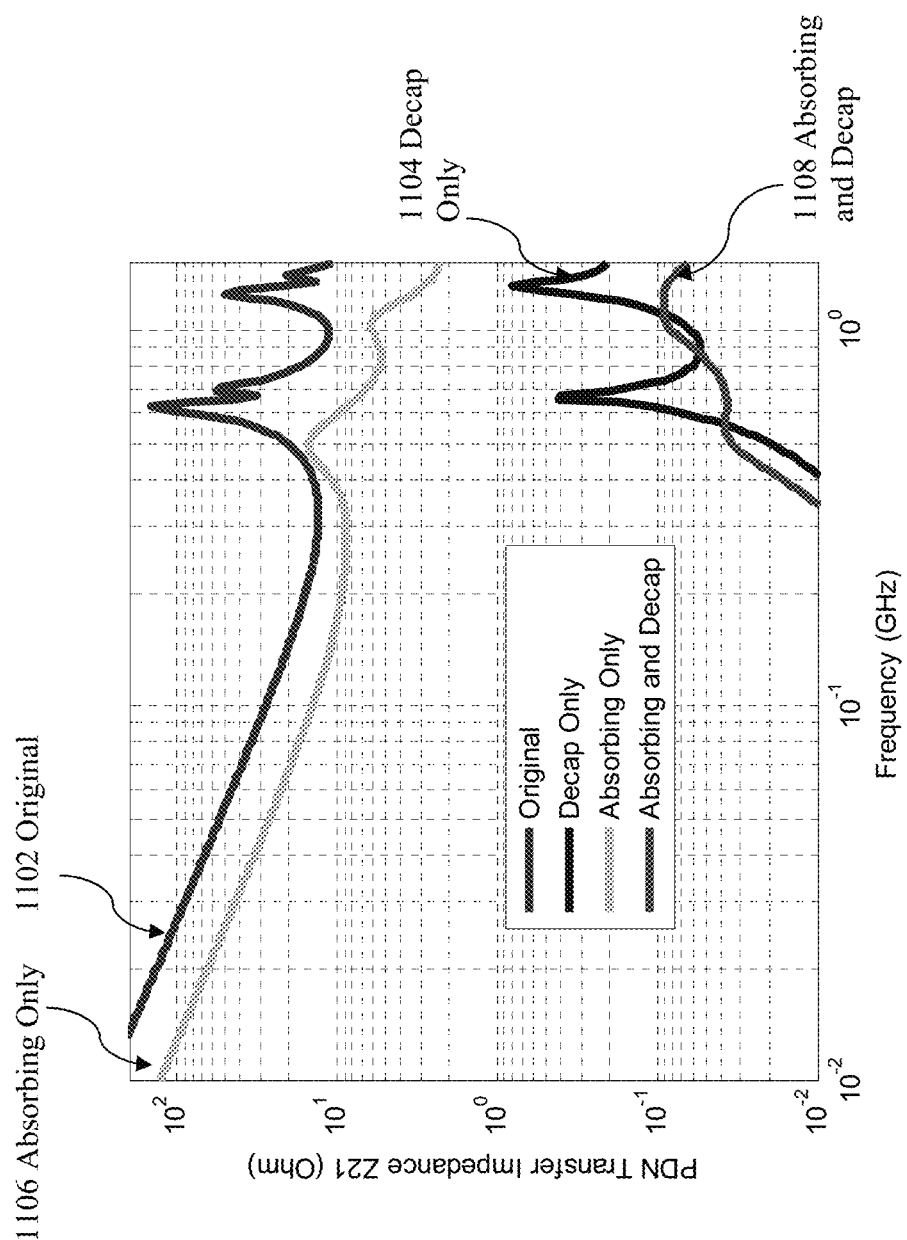

The simulation results show that when decoupling capacitors are used exclusively, they help lower impedance at sub-GHz range. Yet, the decoupling capacitors alone could not lower the sharp anti-resonant peaks which represent concentrated energy at a particular resonant frequency point. As shown in FIG. 11, the decoupling capacitors appear to be effective between 100 KHz and 100 MHz. However, when complemented with the electromagnetic absorbing material, the impedance results depicted by curve 1008 were obtained. The strong dampening traits of the electromagnetic absorbing material along with the decoupling capacitors helped target the sharp resonant peaks directly. From the results, it can be seen that if more decoupling capacitors were used instead of electromagnetic absorbing material, the sharp upper peaks of the impedance may potentially shift to either lower or higher frequencies. It should be noted that electromagnetic absorbing material, in general, is a broadband solution for frequencies up to 40 GHz.

Figure 12:
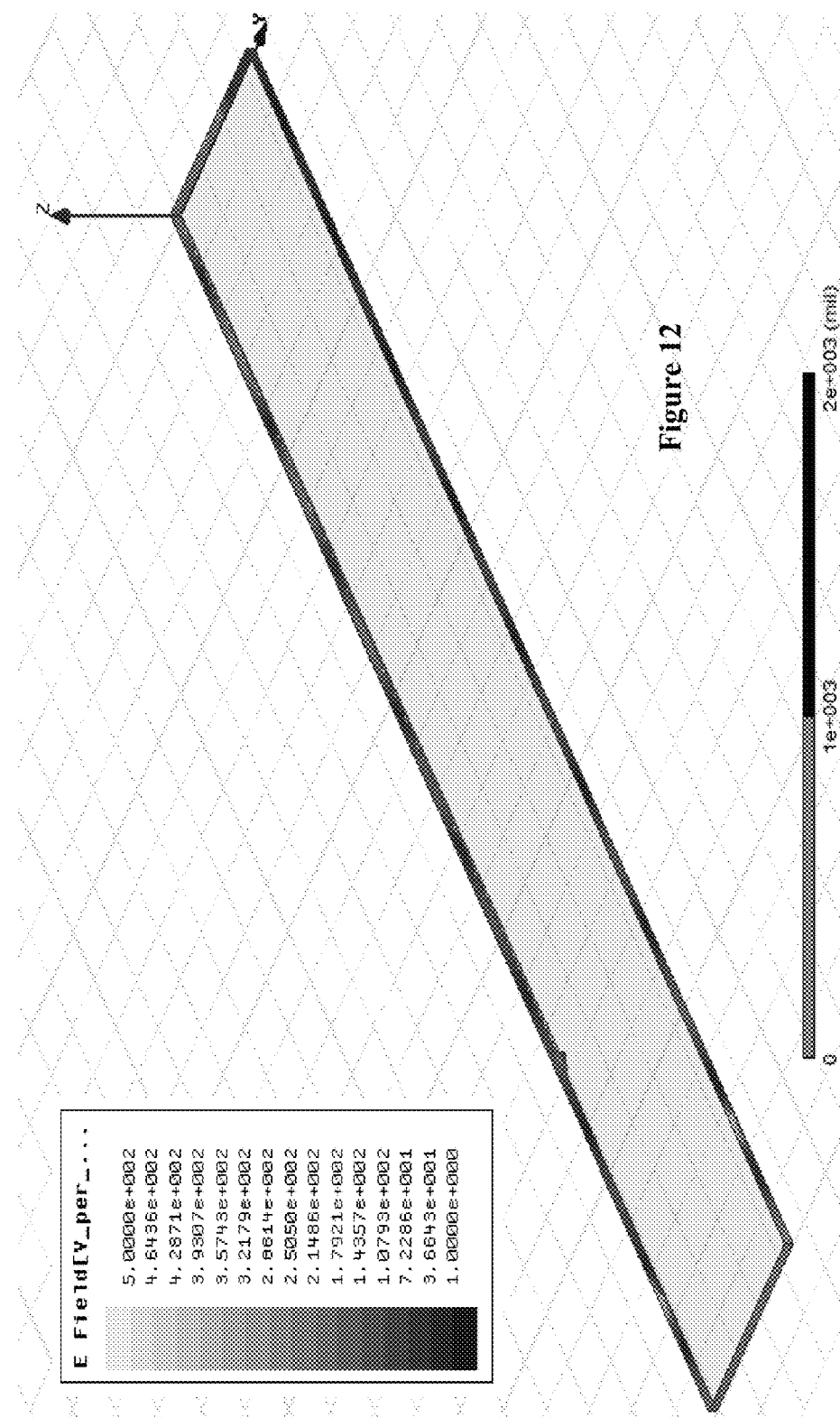
Figure 13:
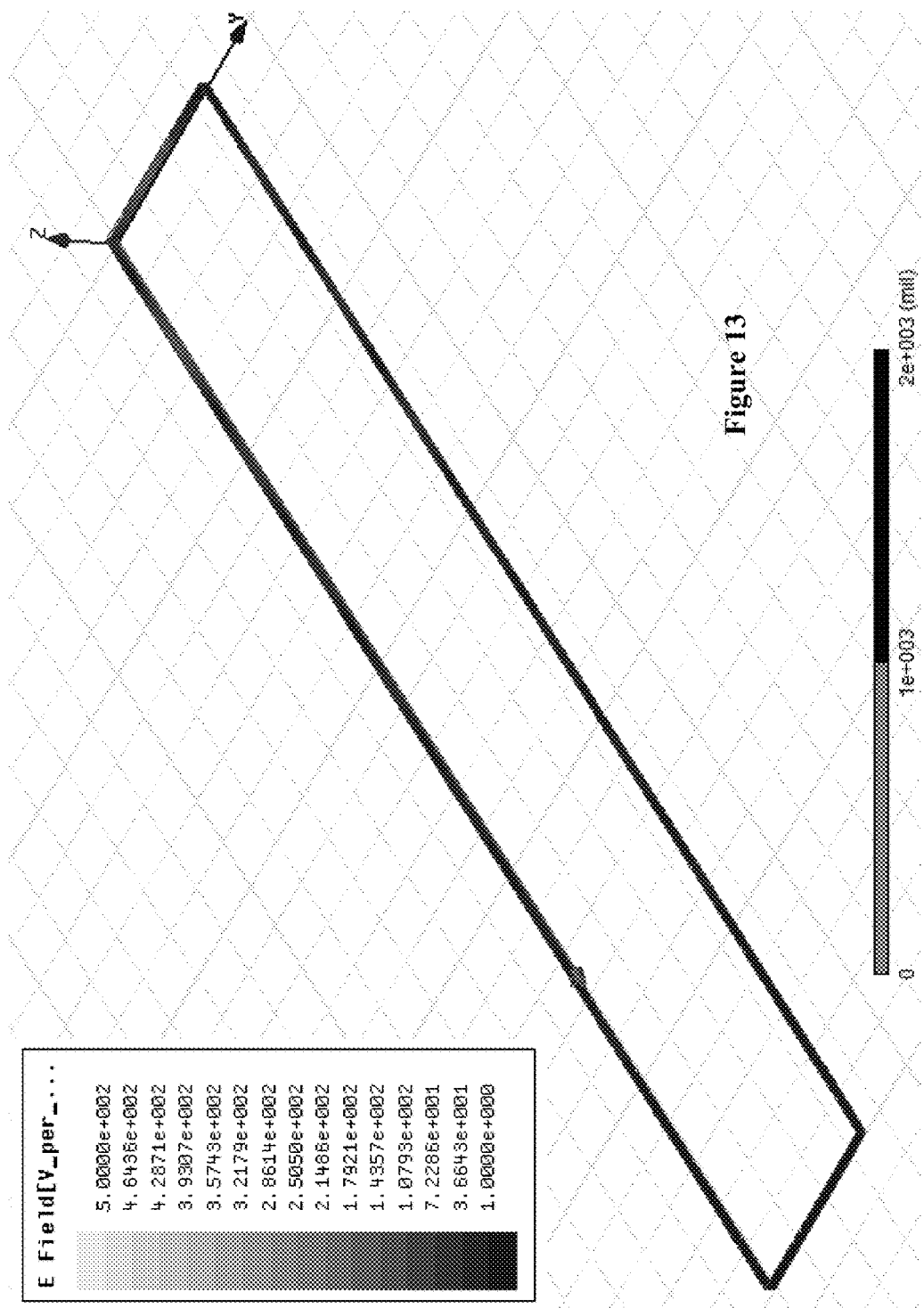

FIG. 12 shows the surface electric field along an edge of the power plane without usage of either decoupling capacitors or electromagnetic absorbing material. FIG. 13 shows the surface electric field along an edge the power plane with electromagnetic absorbing material. Comparing FIGS. 12 and 13, it can be seen the electromagnetic absorbing material significantly suppresses the surface electric field along the edge. Since the surface electric field is equivalent to antenna sources in EMC emission problems, the electromagnetic absorbing material can reduce the emission fields from the PCB.

Figure 14:
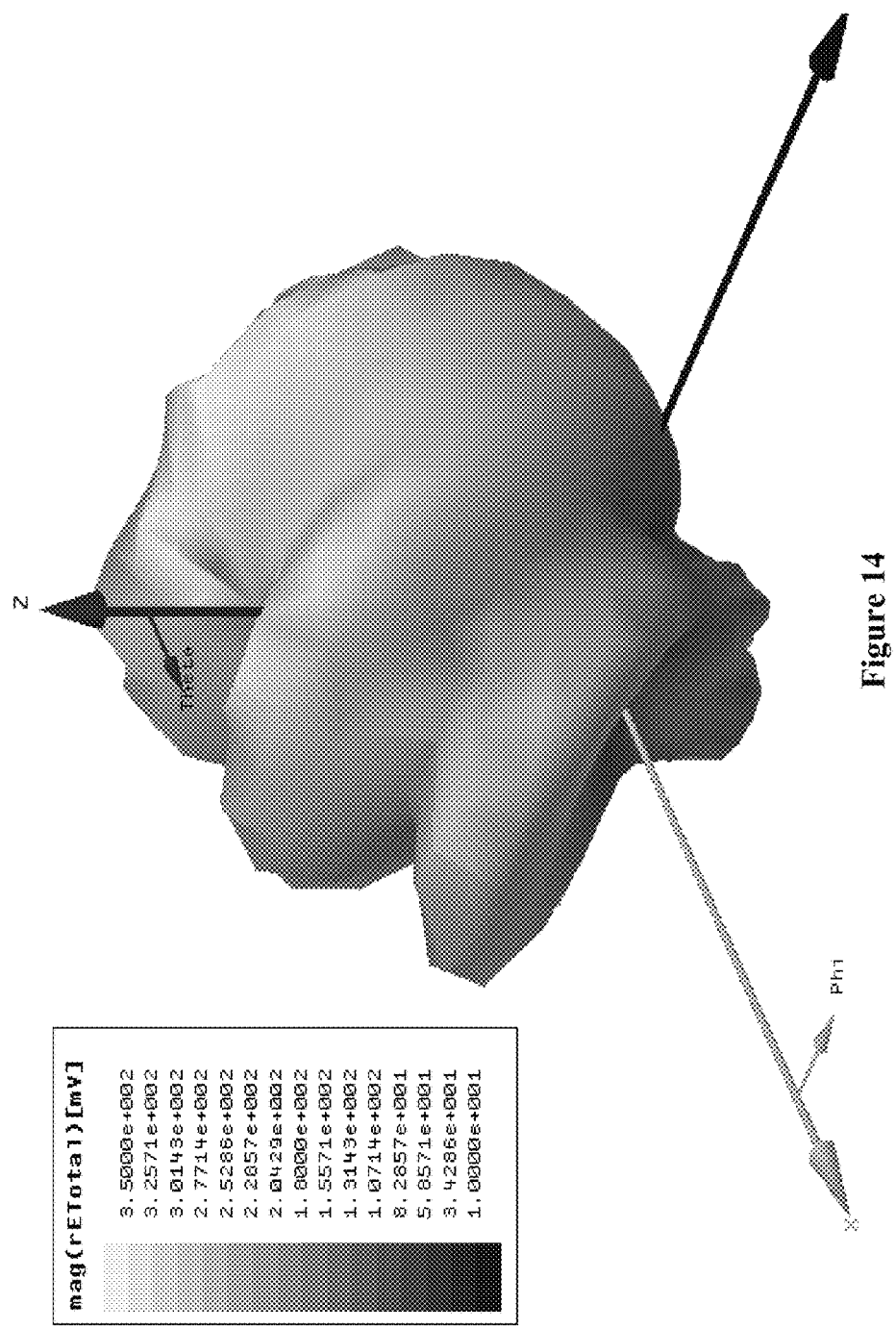
Figure 15:
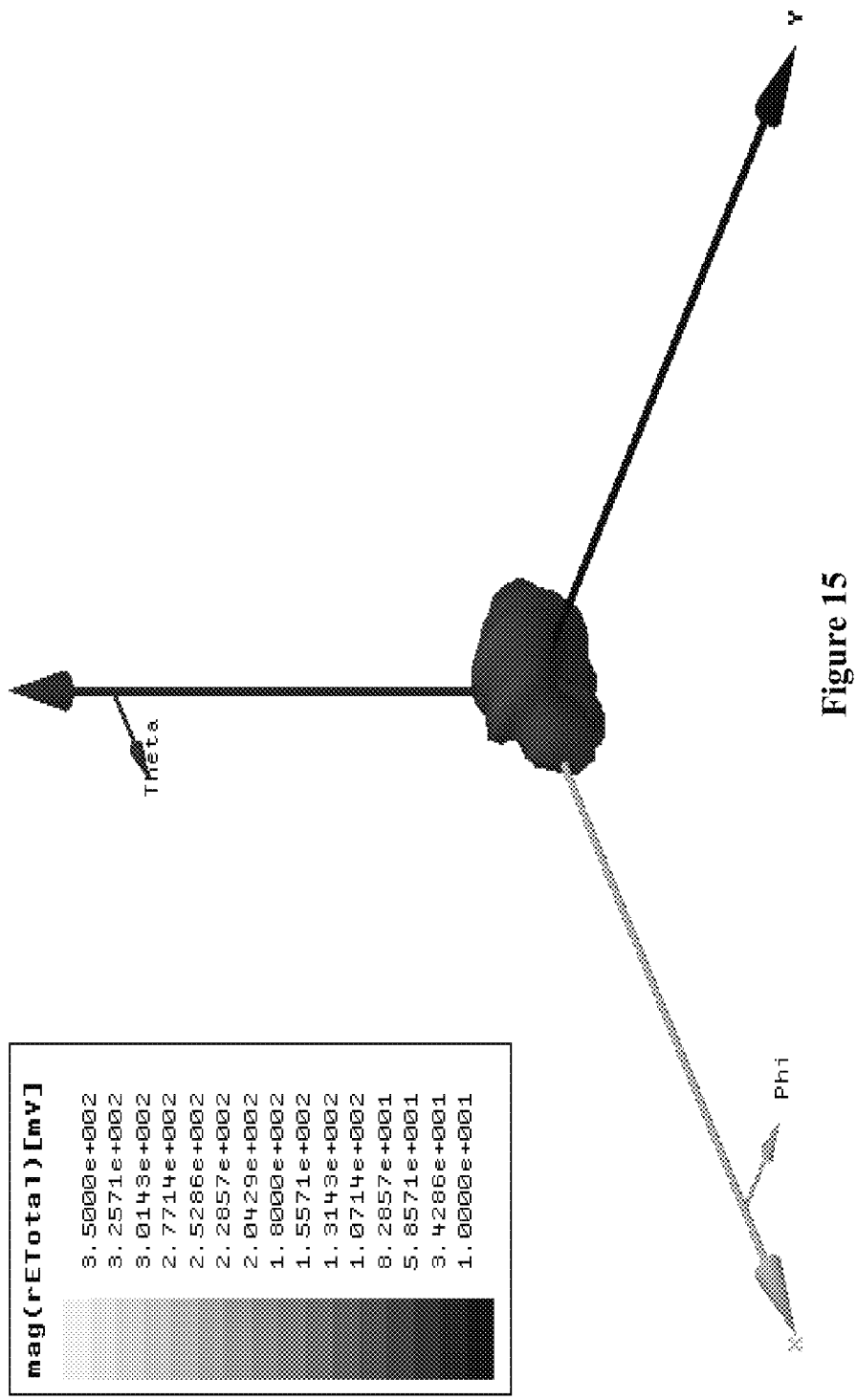

FIG. 14 shows the radiation electric field of the power plane without either decoupling capacitor or electromagnetic absorbing material. FIG. 15 shows the radiation electric field with electromagnetic absorbing material at frequency of 5 GHz. The two Figures demonstrate that the electromagnetic absorbing material significantly reduce the radiation E-field by about 10 dB. And the electromagnetic absorbing material may make more than 20 dB suppression of radiated emission power (Poynting vector). This indicates the hybrid decoupling capacitor and electromagnetic absorbing material technique has great potential for EMC and EMI applications, as well as PDN impedance dampening.

While FIGS. 8-15 have illustrated the novel application of the hybrid decoupling capacitor and electromagnetic absorbing material technique to a power plane, it should be noted that the hybrid technique may be applied equally to a ground plane. Additionally, the technique may be applied to power or ground plane of a semiconductor package.

Further, the hybrid decoupling capacitor and electromagnetic absorbing material technique may be better than prior art power supply noise suppression or EMI reduction methods because:

(a) While decoupling capacitors can reduce the PDN cavity impedances, the bandwidth of a single decoupling capacitor is usually narrow. Thus, in order to achieve broadband suppression of PDN noise, complicated multiple decoupling capacitors may be needed. This not only increases the cost but also takes more substrate area. Second, the parasitic series inductance and resistance of the capacitor have negative effects on the PDN impedance.

(b) Add shorting vias can push cavity resonances to higher frequency. Further, the feasibility of adding shorting vias is limited by board area and the interference of internal routing. Additionally, shorting vias can "push" the resonance to higher frequency, but cannot "reduce" the energy of resonance. Because, a "wall" of dense shorting vias physically create perfect electric conductor (PEC) condition, which is opposite to the perfect magnetic conductor (PMC) condition created by open edge.

(c) Applying metal enclosures on a chassis or components can shield off radiated field emissions, most of which are from the PCB and package edge. However, metal enclosures have several limitations: i) they can only mitigate the external radiation issues, not a solution for suppression of the power/ground noise; ii) there are mechanical restrictions for placing external enclosures; iii) the metal components such as hint sink can act as antenna structures and can become other sources of radiated emissions; iv) metal enclosures may be not helpful for the open-chassis requirements in EMC testing.

Figure 16:
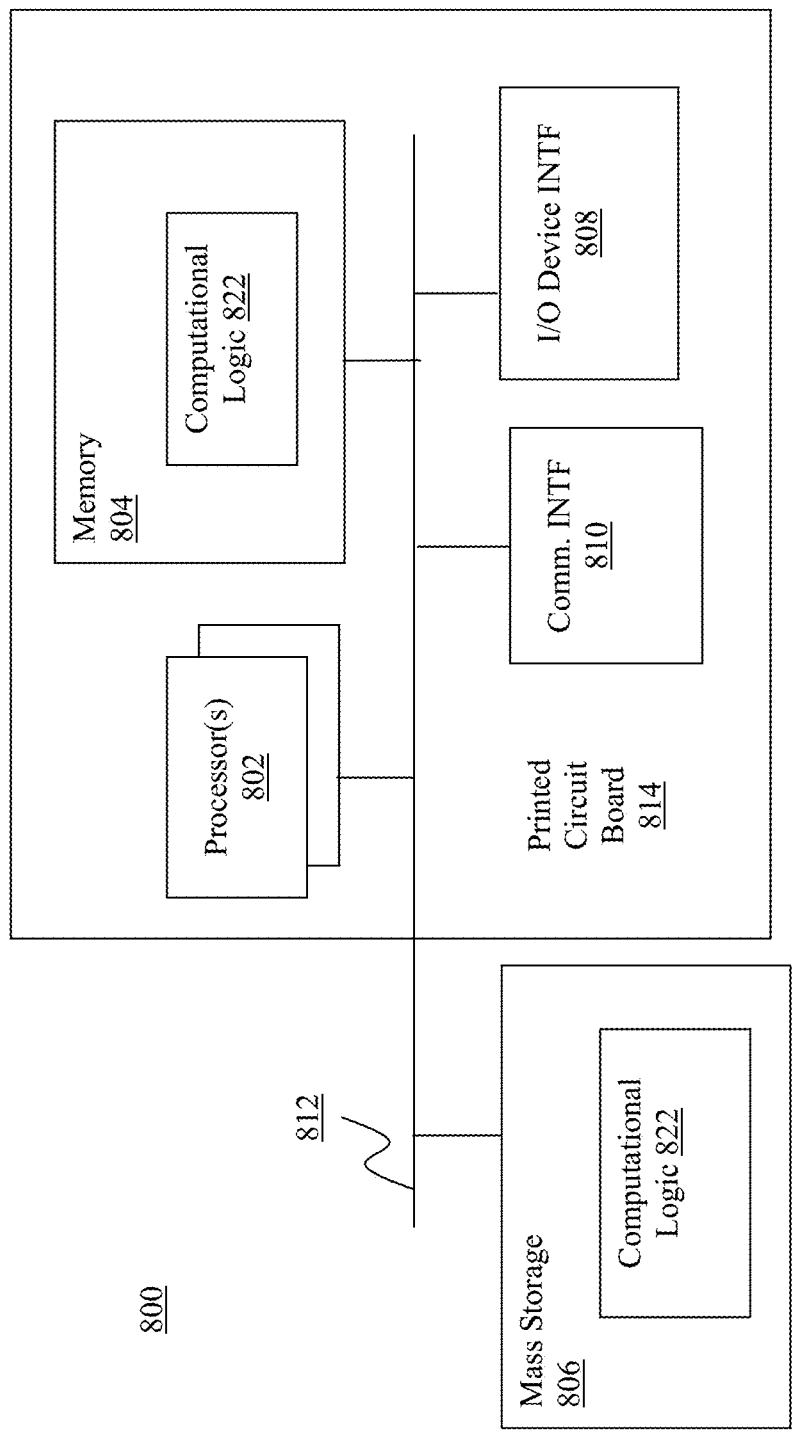
FIG. 16 illustrates an example computer system having a PCB incorporated with the shield line and/or a power or ground plane having complementary decoupling capacitors and electromagnetic absorbing material teachings of the present disclosure, according to various embodiments.
Figure 17:
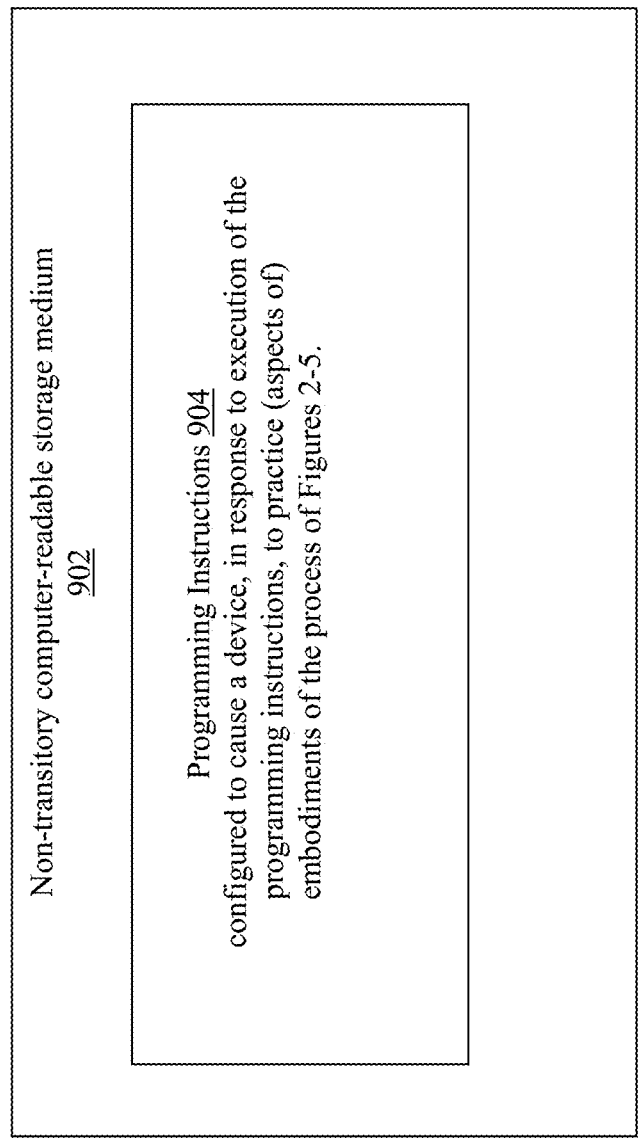

FIG. 16 illustrates an example computer system having a PCB incorporated with the shield line and/or hybrid decoupling capacitor and electromagnetic absorbing material technology of the present disclosure. As shown, computer 800 may include PCB 814, and disposed thereon, one or more processors or processor cores 802, and system memory 804. PCB 814 may be PCB 102 of FIG. 1 having shield line 108. PCB 814 may also include power plane 800 of FIG. 8 or a ground plane having the hybrid decoupling capacitor and electromagnetic absorbing material technology implemented thereon. For the purpose of this application, including the claims, the terms "processor" and "processor cores" may be considered synonymous, unless the context clearly requires otherwise. Additionally, disposed thereon may be input/output device interfaces 808 (for interfacing with I/O devices such as display, keyboard, cursor control and so forth) and communication interfaces 810 for communication devices (such as network interface cards, modems and so forth). The elements may be coupled to each other via system bus 812, which may represent one or more buses, and various transmission lines (not shown), such as microstrips or striplines, having shield lines disposed in between to reduce their crosstalk interferences as earlier described. In the case of multiple buses, they may be bridged by one or more bus bridges (not shown). Additionally, computer 800 may include mass storage devices 806 (such as diskette, hard drive, compact disc read only memory (CD-ROM) and so forth).

Each of these elements may perform its conventional functions known in the art. However, one or more of the semiconductor components, such as processor 802, memory 804 and so forth, may be incorporated with the shield line and/or hybrid decoupling capacitor and electromagnetic absorbing material technology of the present disclosures. System memory 804 and mass storage devices 806 may be employed to store a working copy and a permanent copy of the programming instructions implementing an operating system and various applications, collectively referred to as computational logic 822. Computational logic 822 may be implemented by assembler instructions supported by processor(s) 802 or high-level languages, such as, for example, C, that can be compiled into such instructions.

The number, capability and/or capacity of these elements 810-812 may vary, depending on whether computer 800 is used as a client or a server device. In particular, when use as client device, the capability and/or capacity of these elements 810-812 may vary, depending on whether the client device is a stationary or mobile device, like a smartphone, computing tablet, ultrabook or laptop. Otherwise, the constitutions of elements 810-812 are known, and accordingly will not be further described.

Thus various example embodiments of the present disclosure have been described including, but are not limited to:

Example 1 may be an apparatus, comprising: a substrate having a ground plane; a first and a second transmission line disposed on or integrated with the substrate; and a shield line constituted with electromagnetic absorbing material disposed between the first and second transmission lines, and not coupled to the ground plane.

Example 2 may be example 1, wherein the shield line is constituted with electromagnetic absorbing material that attenuates electromagnetic noises from 5 MHz to 40 GHz.

Example 3 may be example 1, wherein the substrate further comprises a dielectric layer disposed on top of the ground plane; and the first and second transmission lines are microstrips disposed on the substrate.

Example 4 may be example 3, wherein the first and second transmission lines are respective members of a first and a second microstrip pairs.

Example 5 may be example 3, wherein each of the first and second transmission lines has a width of about 4.6 mils and a height of about 2.7 mils, and spaced about 13.5 mils from each other; and the shield line has a width of about 5 mils and a height of about 8 mils.

Example 6 may be example 3, further comprising a soldermask covering the first and second transmission lines and the shield line.

Example 7 may be example 6, wherein both the soldermask and the shield line have a same height.

Example 8 may be example 6, wherein the shield line has a first height, and the soldermask has a second height greater than the first height.

Example 9 may be example 1, wherein the substrate further comprises a dielectric layer disposed on top of the ground plane; the first and second transmission lines and the shield line are integrated within the dielectric layer; the apparatus further includes another ground plane disposed on top of the dielectric layer; and the first and second transmission lines are striplines.

Example 10 may be example 9, wherein the first and second transmission lines are respective members of a first and a second stripline pairs Example 11 may be an apparatus, e.g. the apparatus of example 1, wherein the substrate further comprises a power plane and a plurality of decoupling capacitors disposed on the power or ground plane, wherein the power or ground plane includes a plurality of edges having electromagnetic absorbing materials adhered thereto, and a plurality of spacing having electromagnetic absorbing materials disposed therein.

Example 12 may be example 11, wherein the decoupling capacitor are disposed on the power or ground plane where resonance characteristics are modulated with the electromagnetic absorbing material.

Example 13 may be example 11, wherein the electromagnetic absorbing materials are pasted, glued, taped, or painted onto the edges.

Example 14 may be example 11, wherein a thickness of the electromagnetic absorbing materials adhered to an edge is about 10 mils.

Example 15 may be example 11, wherein the plurality of spacing are about 10 mils.

Example 16 may be any one of examples 1-15, wherein the apparatus is a printed circuit board.

Example 17 may be any one of examples 1-15, wherein the apparatus is a computing device having a printed circuit board that includes the substrate, the first and second transmission lines, and the shield line.

Example 18 may be example 17, wherein the computing device is blade server.

Example 19 may be a method, comprising: forming a substrate having a ground plane; forming a first and a second transmission line on or integrated with the substrate; and forming a shield line constituted with electromagnetic absorbing material between the first and second transmission lines, and not coupled to the ground plane.

Example 20 may be example 19, wherein forming a shield line comprises forming a shield line constituted with electromagnetic absorbing material that attenuates electromagnetic noises from 5 MHz to 40 GHz.

Example 21 may be example 19, wherein the substrate further comprises a dielectric layer disposed on top of the ground plane; wherein forming the first and second transmission lines comprises disposing first and second microstrips on the substrate.

Example 22 may be example 21, wherein disposing first and second microstrips on the substrate comprises disposing first and second members of a first and a second microstrip pairs on the substrate.

Example 23 may be example 21, wherein each of the first and second transmission lines has a width of about 4.6 mils and a height of about 2.7 mils, and spaced about 13.5 mils from each other; and the shield line has a width of about 5 mils and a height of about 8 mils.

Example 24 may be example 21, further comprising forming a soldermask to cover the first and second transmission lines and the shield line.

Example 25 may be example 24, wherein forming a soldermask comprises forming a soldermask have a same height as the shield line.

Example 26 may be example 25, wherein the shield line has a first height, and forming a soldermask comprises forming a soldermask have a second height greater than the first height.

Example 27 may be example 19, wherein the substrate further comprises a dielectric layer disposed on top of the ground plane; the first and second transmission lines and the shield line are integrated within the dielectric layer; and the method further includes forming another ground plane disposed on top of the dielectric layer; wherein forming the first and second transmission lines comprises first and second striplines.

Example 28 may be example 19, wherein disposing the first and second transmission lines comprises disposing respective members of a first and a second stripline pairs.

Example 28 may be a method, e.g. the method of example 19, wherein the substrate comprises a power plane and wherein the method comprises disposing a plurality of decoupling capacitors on the power or ground plane; adhering electromagnetic absorbing materials to a plurality of edges of the power or ground plane; and disposing electromagnetic absorbing materials in a plurality of spacing of the power or ground plane.

Example 30 may be example 29, wherein disposing the decoupling capacitor comprises disposing the decoupling capacitor on the power or ground plane where resonance characteristics are modulated with the electromagnetic absorbing material.

Example 31 may be example 29, wherein adhering the electromagnetic absorbing materials comprises pasting, gluing, taping, or painting the electromagnetic absorbing materials onto the edges.

Example 32 may be example 29, wherein adhering the electromagnetic absorbing materials comprises adhering a thickness of the electromagnetic absorbing materials of about adhered 10 mils to an edge.

Example 33 may be example 29, wherein disposing the electromagnetic absorbing materials comprises disposing electromagnetic absorbing materials of about 10 mils in the plurality of spacing.

Example 34 may be an apparatus comprising: a substrate having a power or ground plane, wherein the power or ground plane includes a plurality of edges and a plurality of spacing; a plurality of decoupling capacitors disposed on the power or ground plane; and electromagnetic absorbing materials adhered to the plurality of edges and disposed in the plurality of spacing.

Example 35 may be example 34, wherein the decoupling capacitor may be disposed on the power or ground plane where resonance characteristics are modulated with the electromagnetic absorbing material.

Example 36 may be example 34, wherein the electromagnetic absorbing materials may be pasted, glued, taped, or painted onto the edges.

Example 37 may be example 34, wherein a thickness of the electromagnetic absorbing materials adhered to an edge may be about 10 mils.

Example 38 may be example 34, wherein the plurality of spacing may be about 10 mils.

Example 39 may be any one of examples 34-38, wherein the apparatus may be a printed circuit board.

Example 40 may be any one of examples 34-38, wherein the apparatus may be a computing device having a printed circuit board that includes the substrate, the first and second transmission lines, and the shield line.

Example 41 may be example 40, wherein the computing device may be a blade server.

Example 42 may be a method comprising: forming a power or ground plane of a substrate; disposing a plurality of decoupling capacitors on the power or ground plane; adhering electromagnetic absorbing materials to edges of the power or ground plane; and disposing electromagnetic absorbing materials a plurality of spacing of the power or ground plane.

Example 43 may be example 42, wherein disposing the decoupling capacitor may comprise disposing the decoupling capacitor on the power or ground plane where resonance characteristics are modulated with the electromagnetic absorbing material.

Example 44 may be example 42, wherein adhering the electromagnetic absorbing materials may comprise pasting, gluing, taping, or painting the electromagnetic absorbing materials onto the edges.

Example 45 may be any one of examples 42-44, wherein adhering the electromagnetic absorbing materials may comprise adhering a thickness of the electromagnetic absorbing materials of about adhered 10 mils to an edge.

Example 46 may be any one of examples 42-44, wherein disposing the electromagnetic absorbing materials may comprise disposing electromagnetic absorbing materials of about 10 mils in the plurality of spacing.

It will be apparent to those skilled in the art that various modifications and variations can be made in the disclosed embodiments of the disclosed device and associated methods without departing from the spirit or scope of the disclosure. Thus, it is intended that the present disclosure covers the modifications and variations of the embodiments disclosed above provided that the modifications and variations come within the scope of any claims and their equivalents.

What is claimed is:

1. An apparatus, comprising:
   a substrate having a ground plane;
   a first and a second transmission line disposed on or integrated with the substrate;
   a shield line constituted with electromagnetic absorbing material disposed between the first and second transmission lines, and not coupled to the ground plane; and
   a soldermask covering the first and second transmission lines and the shield line.

2. The apparatus of claim 1, wherein the shield line is constituted with electromagnetic absorbing material that attenuates electromagnetic noises from 5 MHz to 40 GHz.

3. The apparatus of claim 1, wherein the substrate further comprises a dielectric layer disposed on top of the ground plane; and the first and second transmission lines are microstrips disposed on the substrate.

4. The apparatus of claim 1, further comprising a third and a fourth transmission line disposed on the substrate; wherein the substrate further comprises a dielectric layer disposed on top of the ground plane, and the first and third, and the second and fourth transmission lines are respective members of a first and a second microstrip pair disposed on the substrate.

5. The apparatus of claim 1, wherein both the soldermask and the shield line have a same height.

6. The apparatus of claim 1, wherein the shield line has a first height, and the soldermask has a second height greater than the first height.

7. The apparatus of claim 1, wherein the substrate further comprises a dielectric layer disposed on top of the ground plane; the first and second transmission lines and the shield line are integrated within the dielectric layer; the apparatus further includes another ground plane disposed on top of the dielectric layer; and the first and second transmission lines are striplines.

8. The apparatus of claim 1, further comprising a third and a fourth transmission line integrated with the substrate; wherein the substrate further comprises a dielectric layer disposed on top of the ground plane; the first, second, third and fourth transmission lines and the shield line are integrated within the dielectric layer; the apparatus further includes another ground plane disposed on top of the dielectric layer; and the first and third, and the second and fourth transmission lines are respective members of a first and a second stripline pair.

9. A method, comprising:
forming a substrate having a ground plane;
forming a first and a second transmission line on or integrated with the substrate;
forming a shield line constituted with electromagnetic absorbing material between the first and second transmission lines, and not coupled with the ground plane; and
forming a soldermask to cover the first and second transmission lines and the shield line.

10. The method of claim 9, wherein the forming of the shield line comprises forming a shield line constituted with electromagnetic absorbing material that attenuates electromagnetic noises from 5 MHz to 40 GHz.

11. The method of claim 9, wherein the substrate further comprises a dielectric layer disposed on top of the ground plane; wherein forming the first and second transmission lines comprises disposing first and second microstrips on the substrate.

12. The method of claim 9, further comprising forming a third and a fourth transmission line; wherein the substrate further comprises a dielectric layer disposed on top of the ground plane; and wherein forming the first and second transmission lines and forming the third and fourth transmission lines comprises disposing first and third members, and second and fourth members of a first and a second microstrip pair on the substrate.

13. The method of claim 9, wherein the substrate further comprises a dielectric layer disposed on top of the ground plane; the first and second transmission lines and the shield line are integrated within the dielectric layer; and the method further includes forming another ground plane disposed on top of the dielectric layer; wherein forming the first and second transmission lines comprises first and second striplines.

14. The method of claim 9, further comprising forming a third and a fourth transmission line integrated with the substrate; wherein the substrate further comprises a dielectric layer disposed on top of the ground plane; the first, second, third and fourth transmission lines and the shield line are integrated within the dielectric layer; and the method further includes forming another ground plane disposed on top of the dielectric layer; wherein disposing the first, second, third and fourth transmission lines comprises disposing respective a first and a third, and a second and a fourth member of a first and a second stripline pair.

15. The method of claim 9, wherein forming the soldermask comprises forming a soldermask have a same height as the shield line.

16. The method of claim 9, wherein the shield line has a first height, and forming the soldermask comprises forming a soldermask have a second height greater than the first height.

* * * * *

UNITED STATES PATENT AND TRADEMARK OFFICE
CERTIFICATE OF CORRECTION

PATENT NO. : 9,806,392 B2
APPLICATION NO. : 14/716101
DATED : October 31, 2017
INVENTOR(S) : Shaowu Huang et al.

Page 1 of 1

It is certified that error appears in the above-identified patent and that said Letters Patent is hereby corrected as shown below:

In the Claims

Column 14
Line 36, "...soldermask have..." should read – "...soldermask having..."
Line 39, "...soldermask have..." should read – "...soldermask having..."

Signed and Sealed this
Twenty-eighth Day of August, 2018

Andrei Iancu
*Director of the United States Patent and Trademark Office*